(12) United States Patent
Frey et al.

(10) Patent No.: US 6,607,288 B2
(45) Date of Patent: *Aug. 19, 2003

(54) MOTOR VEHICLE HEADLIGHT WITH HIGH-PRESSURE GAS DISCHARGE LAMP

(75) Inventors: Martin Frey, Lichtenstein (DE); Ingo Gorille, Oberriexingen (DE)

(73) Assignee: Robert Bosch GmbH, Stuttgart (DE)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

This patent is subject to a terminal disclaimer.

(21) Appl. No.: 09/077,129

(22) PCT Filed: Oct. 15, 1996

(86) PCT No.: PCT/DE96/01956

§ 371 (c)(1),
(2), (4) Date: Sep. 14, 1998

(87) PCT Pub. No.: WO97/20168

PCT Pub. Date: Jun. 5, 1997

(65) Prior Publication Data

US 2001/0014022 A1 Aug. 16, 2001

(30) Foreign Application Priority Data

Nov. 24, 1995 (DE) .......................... 195 43 852

(51) Int. Cl.$^7$ .............. F21V 17/14; B60Q 1/04
(52) U.S. Cl. ....................... 362/265; 362/547
(58) Field of Search ................ 362/546, 547, 362/548, 549, 294, 373, 265, 264, 221; 174/35 MS; 313/313; 315/85

(56) References Cited

U.S. PATENT DOCUMENTS

| 4,507,719 | A | * | 3/1985 | Quiogue ................ 362/294 |
| 4,920,459 | A | * | 4/1990 | Rothwell, Jr. et al. ...... 362/265 |
| 5,107,405 | A | * | 4/1992 | Makita ................ 362/265 |
| 5,343,370 | A | * | 8/1994 | Ohashi et al. ........... 362/265 |
| 5,420,769 | A | * | 5/1995 | Ahlgren et al. ............ 362/373 |
| 5,865,531 | A | * | 2/1999 | Frey et al. ............... 362/373 |

FOREIGN PATENT DOCUMENTS

DE   35 19 611 A1   12/1986

\* cited by examiner

Primary Examiner—Y. My Quach-Lee
(74) Attorney, Agent, or Firm—Kenyon & Kenyon

(57) ABSTRACT

An automotive headlight with a high-pressure gas discharge lamp arranged inside a reflector contains an electronic ballast in a housing for operation of the high-pressure gas discharge lamp. The housing dissipates heat generated by the electronic unit in particular and possibly also by the high-pressure gas discharge lamp and provides an electromagnetic shield against any resulting electronic radiation. Cooling ribs may be provided on the housing to aid in heat dissipation.

10 Claims, 1 Drawing Sheet

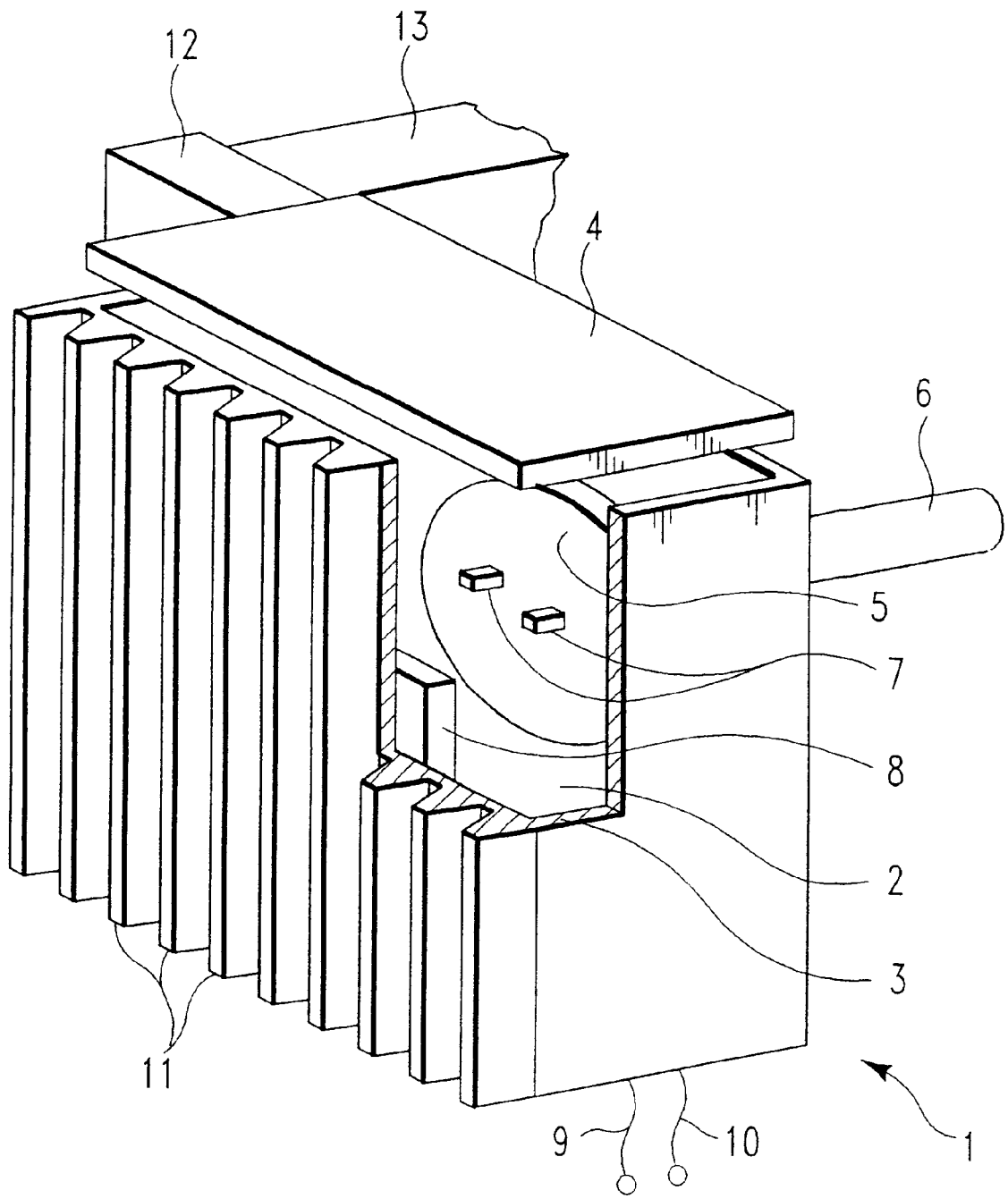

MOTOR VEHICLE HEADLIGHT WITH HIGH-PRESSURE GAS DISCHARGE LAMP

BACKGROUND INFORMATION

An automotive headlight with a high-pressure gas discharge lamp is described in German Patent Application No. 35 19 611 A1. In the described headlight, a molded housing is provided on the rear part of the reflector. The housing contains an electronic ballast that supplies the lamp with a high frequency starting and operating voltage. The high-pressure gas discharge lamp is inserted directly into the ballast through an opening in the reflector. An elastic sealing compound is inserted between the reflector and the molded housing to protect against harmful effects of moisture and corrosion. The ballast is supplied with voltage from the vehicle's on-board electric system over a simple pair of cables.

In the described automotive headlight with a high-pressure gas discharge lamp, the molded housing is described explicitly as made of plastic. Together with the installation site directly on the reflector, this serves to design and arrange the ballast in the motor vehicle so that it is protected from the effects of weather without requiring any additional space; electric sparkover to other parts of the vehicle being prevented and the high-voltage lines being short to reduce capacitive losses.

This plastic housing for the ballast is not capable of dissipating enough of the heat generated in its interior by the lamp and its electronic unit. In addition, this plastic housing is unable to prevent interference voltage generated in its interior by the electronic unit of the ballast from being radiated out of the housing. Electronic components and devices in the engine compartment are thus endangered by the interference voltage emitted. Therefore, the required electromagnetic compatibility of this arrangement is not guaranteed.

SUMMARY OF THE INVENTION

An object of the present invention is to provide an automotive headlight with a high pressure gas discharge lamp having guaranteed dissipation of heat to protect the electronic unit accommodated in the interior of the housing, plus total shielding of the interior of the housing from the environment so that ballast-generated interference voltage is not radiated out of the housing. The electromagnetic compatibility of the automotive headlight with a high-pressure gas discharge lamp designed according to the present invention is thus ensured. This is an extremely important prerequisite for practical use. The parts contained in the interior of the housing are protected and shielded from effects from the external environment, while increasing their functional reliability.

According to the present invention, the housing is designed to dissipate heat and provide electromagnetic shielding to dissipate the heat generated by the electronic unit and possibly also the high-pressure gas discharge lamp and to provide a shield against the resulting electromagnetic radiation.

According to one embodiment of the present invention, the housing is provided with an internal and/or external coating to provide a shield against electromagnetic radiation from the electronic unit or the environment.

In an alternative embodiment, the material provided for the housing may be one that not only dissipates heat but also fulfills the function of providing electromagnetic shielding.

For more reliable and more intense dissipation of heat, the housing of the present invention is provided with parts that enlarge the surface area, in particular in the form of cooling ribs, for the purpose of dissipation of heat.

According to the present invention, the high pressure gas discharge lamp maybe either permanently or replaceably attached to the housing.

To make handling of installation simple and acceptable, the housing may be attached to the reflector by means of a standardized locking mechanism, in particular a bayonet lock.

BRIEF DESCRIPTION OF THE DRAWING

The drawing shows a perspective schematic view of an exemplary housing according to the present invention, with a corner cut away to provide a view into the interior.

DETAILED DESCRIPTION

The drawing shows a schematic perspective view of a housing 1 designed according to the present invention, with one corner 3 cut away to allow a view into interior 2. A cover 4 of housing 1 is shown slightly lifted away to better illustrate a base 5 for a high-pressure gas discharge lamp 6. Base 5 contains two terminal posts 7 into which terminal electrodes (inside socket 1, but not shown here) of the high-pressure gas discharge lamp 6 can be inserted. High-pressure gas discharge lamp 6 is supplied via terminal posts 7 with electric power generated by electronic unit 8 (only suggested in the figure) and is thereby controlled and regulated. Electronic unit 8 itself is supplied with d.c. voltage of 12 V, for example, from the automotive battery (not shown) over simple cable sets 9 and 10 which are led into housing 1 at a suitable location.

According to the present invention, housing 1 is designed to dissipate heat and provide electromagnetic shielding. In particular, the heat generated by electronic unit 8 and possibly also by high-pressure gas discharge lamp 6 is removed, and shielding is provided against the resulting electromagnetic radiation. According to one embodiment of the present invention, housing 1 is made of a heat-dissipating material. In another embodiment, housing 1 may be provided with a coating inside and/or outside to provide a shield against the electromagnetic radiation of electronic unit 8 or radiation coming from the outside.

In an alternative embodiment, the material provided for housing 1 may be one that not only dissipates heat but also fulfills the function of providing electromagnetic shielding.

For more reliable and more intense dissipation of heat, housing 1 is provided with parts that increase the surface area to dissipate heat, in particular in the form of cooling ribs 11.

In another embodiment of the present invention, high-pressure gas discharge lamp 6 is either permanently or replaceably attached to housing 1. In the embodiment according to FIG. 1, base 5 with high-pressure gas discharge lamp 6 is designed to be removable.

To make installation simple and acceptable, in an advantageous embodiment of the invention, housing 1 can be optionally attached to a reflector 13 by means of a standardized locking mechanism 12, in particular a bayonet lock 12. This optional bayonet lock 12 and the optional reflector 13 is shown in the embodiment illustrated in the drawing.

The present invention makes available an electromagnetically compatible ballast for high-pressure gas discharge lamps.

What claimed is:

1. An automotive headlight, comprising:
a high-pressure gas discharge lamp provided within a reflector;
a housing arranged directly on the reflector and attached to the reflector via a locking mechanism; and
an electronic ballast for operating the high-pressure gas discharge lamp provided within the housing, wherein the housing dissipates heat generated by the electronic ballast, and wherein the housing provides an electromagnetic shield against electromagnetic radiation,
wherein the locking mechanism is a bayonet lock.

2. The automotive headlight according to claim 1, wherein the housing includes a heat-dissipating material.

3. The automotive headlight according to claim 2, wherein a coating is provided on at least one of an inside of the housing and an outside of the housing to further shield the electromagnetic radiation from the electronic ballast.

4. The automotive headlight according to claim 2, wherein the housing includes a shielding material, wherein the shielding material blocks the electromagnetic radiation.

5. The automotive headlight according to claim 1, wherein the housing includes parts to increase a surface area of the housing.

6. The new automotive headlights according to claim 5, wherein the part include cooling ribs.

7. The automotive headlight according to claim 1, wherein the high-pressure gas discharge lamp is attached to the housing by one of a permanent attachment and a replaceable attachment.

8. The automotive headlight according to claim 1, wherein the housing also dissipates heat generated by the high-pressure gas discharge lamp.

9. An automotive headlight, comprising:
a high-pressure gas discharge lamp extending from a ballast housing; and
an electronic ballast for operating the high-pressure gas discharge lamp, wherein the electronic ballast is provided within the ballast housing, wherein heat generated by the electronic ballast is dissipated by the ballast housing,
wherein the ballast housing also provides an electromagnetic shield against electromagnetic radiation from the electronic ballast and, wherein a reflector is attached to the ballast housing via a locking mechanism.

10. An automotive headlight, comprising:
a high-pressure gas discharge lamp extending from a ballast housing;
an electronic ballast for operating the high-pressure gas discharge lamp, wherein the electronic ballast is provided within the ballast housing, wherein heat generated by the electronic ballast is dissipated by the ballast housing; and,
wherein a reflector is attached to the ballast housing via a locking mechanism, and wherein the locking mechanism is a bayonet lock.

* * * * *

UNITED STATES PATENT AND TRADEMARK OFFICE
CERTIFICATE OF CORRECTION

PATENT NO. : 6,607,288 B2
DATED : August 19, 2003
INVENTOR(S) : Frey et al.

It is certified that error appears in the above-identified patent and that said Letters Patent is hereby corrected as shown below:

Column 3,
Line 27, change "part include" to -- parts include --.

Signed and Sealed this

First Day of June, 2004

JON W. DUDAS
*Acting Director of the United States Patent and Trademark Office*